United States Patent
Atkinson

(10) Patent No.: US 7,369,624 B2
(45) Date of Patent: May 6, 2008

(54) CARRIER SUPPRESSION TYPE MODULATOR WITH ENCODED MODULATING SIGNALS

(75) Inventor: Leonard Alan Atkinson, Oak Hill, VA (US)

(73) Assignee: Orbital Sciences Corp., Dulles, VA (US)

( * ) Notice: Subject to any disclaimer, the term of this patent is extended or adjusted under 35 U.S.C. 154(b) by 709 days.

(21) Appl. No.: 10/856,801

(22) Filed: Jun. 1, 2004

(65) Prior Publication Data

US 2005/0013385 A1   Jan. 20, 2005

(51) Int. Cl.
*H04L 27/04* (2006.01)
(52) U.S. Cl. .................................... 375/295
(58) Field of Classification Search ............... 375/242, 375/253.295, 298, 302, 308; 332/103
See application file for complete search history.

(56) References Cited

U.S. PATENT DOCUMENTS

| | | | |
|---|---|---|---|
| 4,243,955 A | 1/1981 | Daniel et al. | 332/37 D |
| 4,267,591 A | 5/1981 | Wissel et al. | 370/11 |
| 4,288,750 A | 9/1981 | Newton et al. | 328/158 |
| 4,447,907 A | 5/1984 | Bjornholt et al. | 375/1 |
| 4,748,641 A | 5/1988 | Dapper | 375/67 |
| 4,804,931 A | 2/1989 | Hulick | 332/31 R |
| 5,077,542 A | 12/1991 | Lanoiselee | 332/151 |
| 5,153,536 A | 10/1992 | Müller | 332/105 |
| 5,450,044 A | 9/1995 | Hulick | 332/103 |
| 5,583,892 A * | 12/1996 | Drakul et al. | 375/353 |
| 5,734,648 A | 3/1998 | Adachi et al. | 370/342 |
| 5,781,300 A | 7/1998 | Strandjord et al. | 356/350 |
| 5,793,817 A | 8/1998 | Wilson | 375/297 |
| 6,058,291 A | 5/2000 | Ketcham | 455/46 |
| 6,687,311 B1 | 2/2004 | Zhang | 375/298 |
| 6,700,453 B2 | 3/2004 | Heiskala et al. | 332/103 |
| 2004/0146118 A1 | 7/2004 | Talwalkar et al. | 375/298 |
| 2005/0239428 A1* | 10/2005 | Seendripu et al. | 455/280 |

FOREIGN PATENT DOCUMENTS

JP   4-369917   12/1992

* cited by examiner

*Primary Examiner*—Don N Vo
(74) *Attorney, Agent, or Firm*—Ropes & Gray LLP

(57) ABSTRACT

A carrier suppressed information signal modulation arrangement employs a plurality of serially coupled modulators. Each of the serially coupled modulators has a carrier input, a modulating signal input and a modulated carrier output. A carrier is applied to the carrier input of the first modulator and the suppressed modulated carrier output of each modulator is coupled to the carrier input of a succeeding modulator. An encoder responsive to the information signal generates modulating signals to be applied to the modulating signal inputs of the serially coupled modulators, such that a product of the modulating signals forms the information signal. The modulating signals applied to each of the serially coupled modulators modifies the modulated carrier output received at the carrier input of the respective modulator to produce a carrier suppressed information signal modulated output of the last of the serially coupled modulators.

42 Claims, 12 Drawing Sheets

CARRIER SUPPRESSION TYPE MODULATOR WITH ENCODED MODULATING SIGNALS

BACKGROUND OF THE INVENTION

1. Field of the Invention

The invention relates to modulation systems and more particularly to modulation arrangements in which the carrier is suppressed.

2. Background of the Invention

In many types of modulated transmission systems, a carrier modulated by an information signal is applied to a medium for transmission. The information signal may be analog or digital and of electrical or optical form. The power in the modulated signal is distributed among the carrier and modulation components. In satellite and other communication systems where the spectrum utilized for communication is crowded, the transmission power of individual channels is restricted to avoid inter-channel interference. To reduce the channel power without impairing information transmission, it is well known, to suppress the carrier component of the transmission signal. Such carrier suppression is important in making wideband frequency allocations to existing narrowband services, in spread spectrum systems where it is difficult to meet regulated spectral density requirements and in a Weaver Demodulator in which a signal is processed to produce an output in the form of an upper sideband.

Carrier suppression has been performed through the use of filters, by precise adjustment of modulator parameters and by balanced type modulators such as described in U.S. Pat. No. 5,450,044 issued to Timothy P. Hulick on Sep. 12, 1995, or in U.S. Pat. No. 4,748,641 issued to Mark J. Dapper on May 31, 1988. In the Dapper patent, a binary phase shift keying type BPSK modulator is disclosed in which the I (in-phase) modulating component of a BPSK signal is mixed with an RF carrier source in one mixer, the Q (quadrature-phase) modulating component of the BPSK signal is mixed with the RF carrier phase shifted by 90 degrees in another mixer and the outputs of the mixers are summed in a summing network. The summing network output then provides a suppressed carrier signal according to the matching of the operating characteristics of the mixers and the balance of modulating signal amplitudes and phases. The degree of carrier suppression in filtered and balanced modulator systems, however, relies on the precise adjustment of the operating characteristics in the transmitter to obtain cancellation of the carrier in the summing network. Such precise adjustment, however, is difficult to achieve and maintain under changing ambient conditions such as temperature, aging, and radiation effects.

In another carrier suppression arrangement for a QAM transmitter disclosed in U.S. Pat. No. 6,687,311 issued to Qin Zhang on Feb. 3, 2004, a monitoring device monitors phase and amplitude errors in an output RF signal with QAM components and provides a feedback signal to an equalizer. The equalizer produces an analog equalizing signal that equalizes the phases and amplitudes of the I and Q components of the QAM signal. Such feedback arrangements are effective to provide carrier suppression without precise modulator adjustments but add significant complexity and cost. The feedback arrangements also require settling time from turn-on until a satisfactory level of carrier suppression level is achieved and are ineffective for burst-communication systems.

FIG. 1 illustrates the operation of a feedback arrangement to stabilize carrier suppression. In FIG. 1, there is a modulator 105, a carrier level detector 110, a carrier null control 115, and a carrier null adjuster 120. A portion of the output of the modulator 105 is supplied to the carrier level detector 110 and the carrier null control 115 provides a carrier null signal responsive to the detected carrier level. The carrier null signal from the carrier null control 115 is combined with a manual adjustment signal in the carrier null adjuster 120. The output of the carrier null adjuster is combined with the input signal through combiner 101 and the combined output is applied as the modulating signal input to the modulator 105. The modulator 105 receives the carrier and an adjusted modulating signal derived from an input signal and the carrier null adjuster 120. The implementation of a feedback arrangement for carrier suppression, however, is subject to manual adjustment and requires added equipment and a significant setting time from turn-on. In satellite and other communication systems where space, weight, and maintenance access are important, the added feedback type carrier suppression equipment is undesirable. Accordingly, it is a problem to provide adequate carrier suppression without requiring either precise adjustment of transmitter parameters or the addition of feedback type carrier suppression equipment.

U.S. Pat. No. 4,447,907 issued to John E. Bjornholt et al., May 8, 1984, discloses a multiple mixer spread spectrum modulation arrangement in which there are plural serially coupled bi-phase modulators and a set of code generators which generate plural binary code signals. The plural binary code signals are phased to have equal relative phase angles and serially modulate an input carrier signal. Each modulator spreads the carrier signal applied thereto. The signal power of the modulated carrier after the serially coupled bi-phase modulators is spread over a range of frequencies determined by the binary coded modulating signals. As a result, the Bjornholt et al. arrangement provides a spread carrier signal that resembles noise for use in a spread spectrum communication rather than a carrier suppressed information signal. Accordingly, the Bjornholt et al. arrangement is suitable only for wideband transmission systems that require or utilize pseudo-random noise spectral spreading signals.

SUMMARY OF THE INVENTION

The invention is directed to apparatus in which a carrier is modulated in a set of serially coupled modulators and in which a modulating signal is applied to each of the serially coupled modulators.

According to one aspect of the invention, modulating signals applied to the serially coupled modulators modify the modulated carrier output received at their carrier inputs to produce a carrier-suppressed information signal modulated output of the last of the plurality of serially coupled modulators, the product of the modulating signals forming the information signal.

According to another aspect of the invention, the modulating signals applied to particular ones of the serially coupled modulators produce a modulation component in the modulated carrier output that substantially removes the modulating component produced by a preceding modulator and the modulating signal applied to the carrier input of one of the serially coupled modulators includes the information signal.

According to yet another aspect of the invention, there are first and second serially coupled modulators. The modulating signal applied to the second modulator has a component that is the reciprocal of the modulating signal applied to the first modulator and also includes the information signal.

According to yet another aspect of the invention, the modulating signal applied to the first modulator of the first and second modulators is a pseudo-random signal.

According to yet another aspect of the invention, the information signal applied to one of the first and second modulators is an analog signal or a quadrature amplitude modulated (QAM) signal.

According to yet another aspect of the invention, the information signal is a binary phase shift keying signal. The modulating signals applied to serially connected first and second modulators for succeeding binary ones in the binary shift keying signal alternates between 1, 1 and −1, −1 and the modulating signal applied to the first and second modulators for succeeding binary zeros in the binary shift keying signal alternates between 1, −1 and −1,1.

According to yet another aspect of the invention, the plurality of serially coupled modulators consists of first and second modulators and the information signal is a quadrature phase shift keying (QPSK) signal. The modulating signals applied to the first and second modulators for succeeding I=−1,Q=−1's in the information signal rotates among I,Qs of (1,1) (−1,−1), (−1,−1) (1,1), (1,−1) (−1,1), (−1,1) (1,−1); the modulating signals applied to the first and second modulators for succeeding I=−1,Q=1's in the information signal rotate among I,Qs of (−1,1) (1,1), (−1,−1) (1,−1), (1,1) (−1,1), (1,−1) (−1,−1); the modulating signals applied to the first and second modulators for succeeding I=1,Q=−1's in the information signal rotate among I,Qs of (1,1) (1,−1), (1,−1) (1,1), (−1,1) (−1,−1), (−1,−1) (−1,1); and the modulating signals applied to the first and second modulators for succeeding I=1,Q=1's in the information signal rotate among I,Qs of (1,1) (1,1), (−1, −1) (−1,−1), (−1,1) (−1,1), (1,−1) (1,−1).

According to yet another aspect of the invention, the plurality of serially coupled modulators consists of first and second modulators and the information signal is a quadrature phase shift keying signal. The modulating signals applied to the first and second modulators for succeeding I=−1,Q=−1's in the information signal is randomly selected among I,Qs of (1,1) (−1,−1), (−1,−1) (1,1), (1,−1) (−1,1), (−1,1) (1,−1); the modulating signals applied to the first and second modulators for succeeding I=−1,Q=1's in the information signal is randomly selected among I,Qs of (−1,1) (1,1), (−1,−1) (1,−1), (1,1) (−1,1), (1,−1) (−1,−1); the modulating signals applied to the first and second modulators for succeeding I=1,Q=−1's in the information signal is randomly selected among I,Qs of (1,1) (1,−1), (1,−1) (1,1), (−1,1) (−1,−1), (−1,−1) (−1,1); and modulating signals applied to the first and second modulators for succeeding I=1,Q=1's in the information signal is randomly selected among I,Qs of (1,1) (1,1), (−1,−1) (−1,−1), (−1,1) (−1,1), (1,−1) (1,−1).

In one embodiment according to the invention, first and second modulators are serially coupled and a carrier is applied to the first modulator. An encoder forms a non-zero pseudo-random pattern signal as the modulating signal that is applied to the first modulator and the product of an information signal and a reciprocal of the non-zero pseudo-random signal as the modulating signal that is applied to the second modulator. The output of the first modulator has a partially suppressed carrier and a non-zero pseudo-random modulation component. In the second modulator, the carrier is further suppressed and the reciprocal non-zero pseudo-random signal modulation component removes the non-zero pseudo-random modulation component from the first modulator. The second modulator outputs the further suppressed carrier and a modulation component corresponding to the information signal.

In another embodiment of the invention, a binary phase shift keying modulator is formed of serially coupled first and second modulators. A binary information signal is applied to an encoder that provides a different modulating signal to each of the first and second modulators. In response to succeeding "ones" in the information signal, the encoder alternately forms a −1 and 1 modulating signal for the first modulator and a 1 and −1 modulating signal for the second modulator to produce a −1 output from the second modulator. In response to succeeding "zeros" in the information signal, the encoder alternately forms a −1 and 1 modulating signal for the first modulator and a −1 and 1 modulating signal for the second modulator to produce a 1 output from the second modulator.

In yet another embodiment of the invention, a binary phase shift keying modulator is formed of serially coupled first and second modulators. A binary information signal is applied to an encoder that provides a different modulating signal to each of the first and second modulators. In response to succeeding "ones" in the information signal, the encoder randomly forms a −1 and 1 modulating signal for the first modulator and a 1 and −1 modulating signal for the second modulator to produce a −1 output from the second modulator. In response to succeeding "zeros" in the information signal, the encoder randomly forms a −1 and 1 modulating signal for the first modulator and a −1 and 1 modulating signal for the second modulator to produce a 1 output from the second modulator.

DETAILED DESCRIPTION OF THE INVENTION

Figure 1:
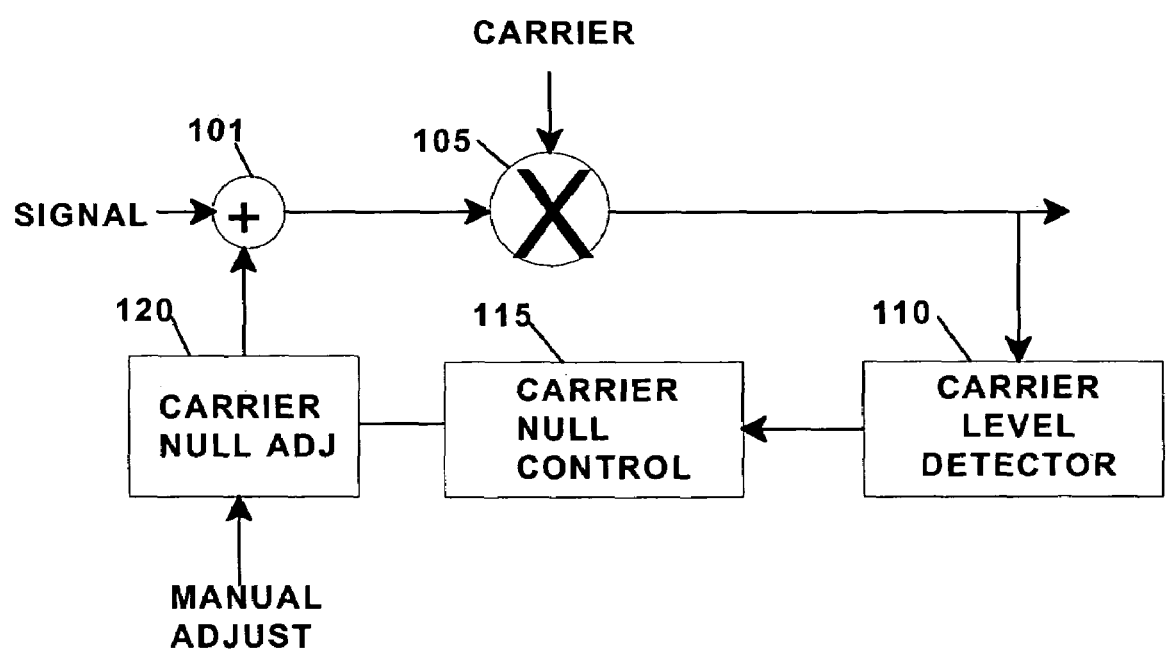
FIG. 1 is a block diagram showing a prior art modulator system using feedback for carrier suppression control.
Figure 2:
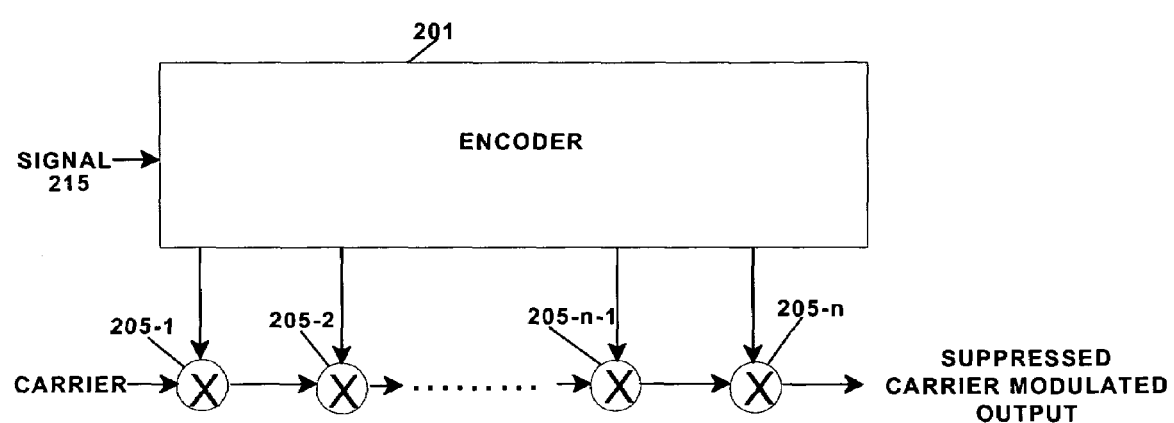
FIG. 2 is a general block diagram of a carrier suppression modulator illustrative of the invention.

To provide carrier suppression of an RF modulator, it is necessary to precisely adjust the modulator characteristics to balance offsets in gain, phase and leakage. For a balanced modulator that uses I and Q inputs, carrier suppression is determined primarily by the DC voltage matching of the signals applied to the I and Q input stages of the modulator, the amplitude balance of the modulator and the carrier leakage. In accordance with the invention, plural modulators are serially coupled to further increase carrier suppression. FIG. 2 shows a general block diagram of a carrier suppression modulator according to the invention. In FIG. 2, there is shown an encoder 201 and serially coupled modulators 205-1, 205-2, ..., 205-$n$-1 and 205-$n$. The serial coupled modulators, for example, may be real or complex analog or digital multipliers. A carrier is applied to a carrier input to modulator 205-1. The output of the modulator 205-1 is applied to the carrier input of modulator 205-2 and, in like manner, the carrier input of each modulator in the modulator chain is coupled to the output of the preceding modulator. An information signal 215 is applied to an input of the encoder 201. The information signal may be an analog signal or a digital signal either real or complex. The encoder 201 provides a modulating signal to each of the modulators 205-1 through 205-$n$. The encoder 201 operates to form the modulating signals such that the product of the modulating signals applied at each instant of time to the modulators corresponds to the information signal. If the information signal 215 is an analog signal or a QAM type signal, the modulating signals formed for one set of modulators, e.g., modulators 205-1, 205-3 ... and 205-$n$-1 may be arbitrarily selected while the signals formed for the remaining modulators, e.g., modulators 205-2, 205-4 ... and 205-$n$ are reciprocals of the modulating signals formed for the modulators 205-1, 205-3 ... and 205-$n$-1. The analog or QAM information signal 215 is multiplied by the modulating signal formed for one or more of the modulators and the resulting product signal is supplied to that modulator. It is to be understood that other arrangements of applying the modulating signals and the reciprocal modulating signals and the information signals to the modulators may be used where the product of the modulating signals corresponds to the information signal.

Figure 3A:
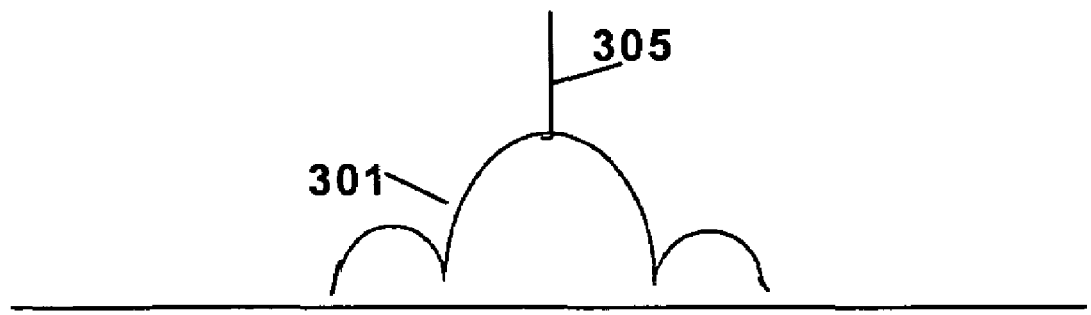
FIGS. 3A, 3B and 3C illustrate the modulated outputs obtained in the carrier suppression modulator of FIG. 2 with increased carrier suppression at each successive stage.
Figure 3B:
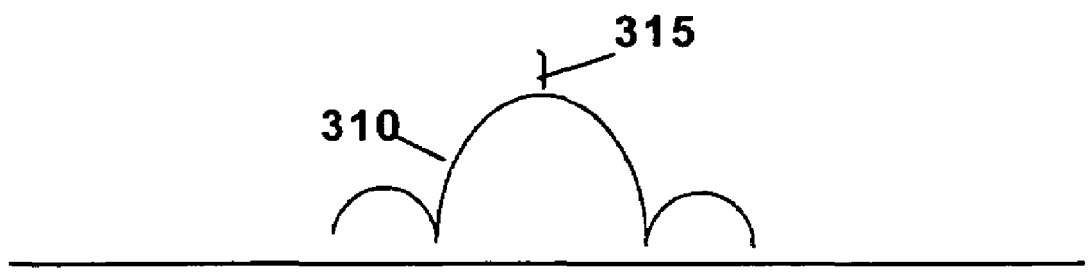
Figure 3C:
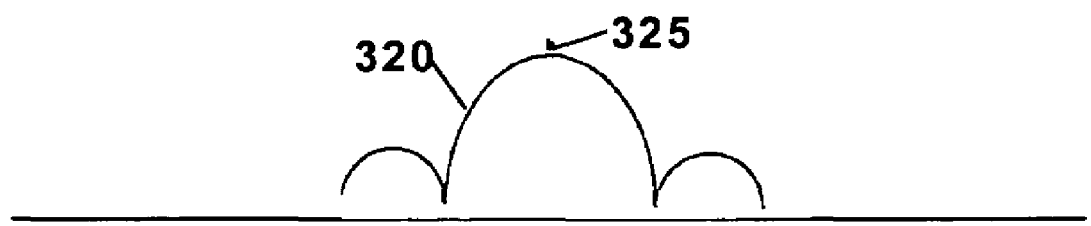

FIGS. 3A, 3B and 3C illustrate the outputs of the modulator 205-1, 205-2 and 205-$n$, respectively. As shown in FIG. 3A, the output of modulator 205-1 has a carrier component 305. The modulator output 301 shown in FIG. 3A (i.e., residual carrier and modulation components) is applied to the carrier input of the modulator 205-2 that further suppresses the carrier and provides a lower carrier level 315 in its output 310 shown in FIG. 3B. Each successive modulator operates to reduce the carrier level so that the output 320 of the last modulator 205-$n$ shown in FIG. 3C has an extremely suppressed carrier 325. Since the arbitrarily selected modulating signals are applied to one set of modulators and reciprocals of the selected modulating signals are applied to the other set of modulators, the modulating component of the output 320 of the last modulator 205-$n$ corresponds to the information signal supplied to one of the modulators. Typically, an individual RF modulator reliably provides 20 dB of carrier suppression. Accordingly, the serial coupling of n modulators as in FIG. 2 provides a much higher carrier suppression of 20*n dB.

Figure 4:
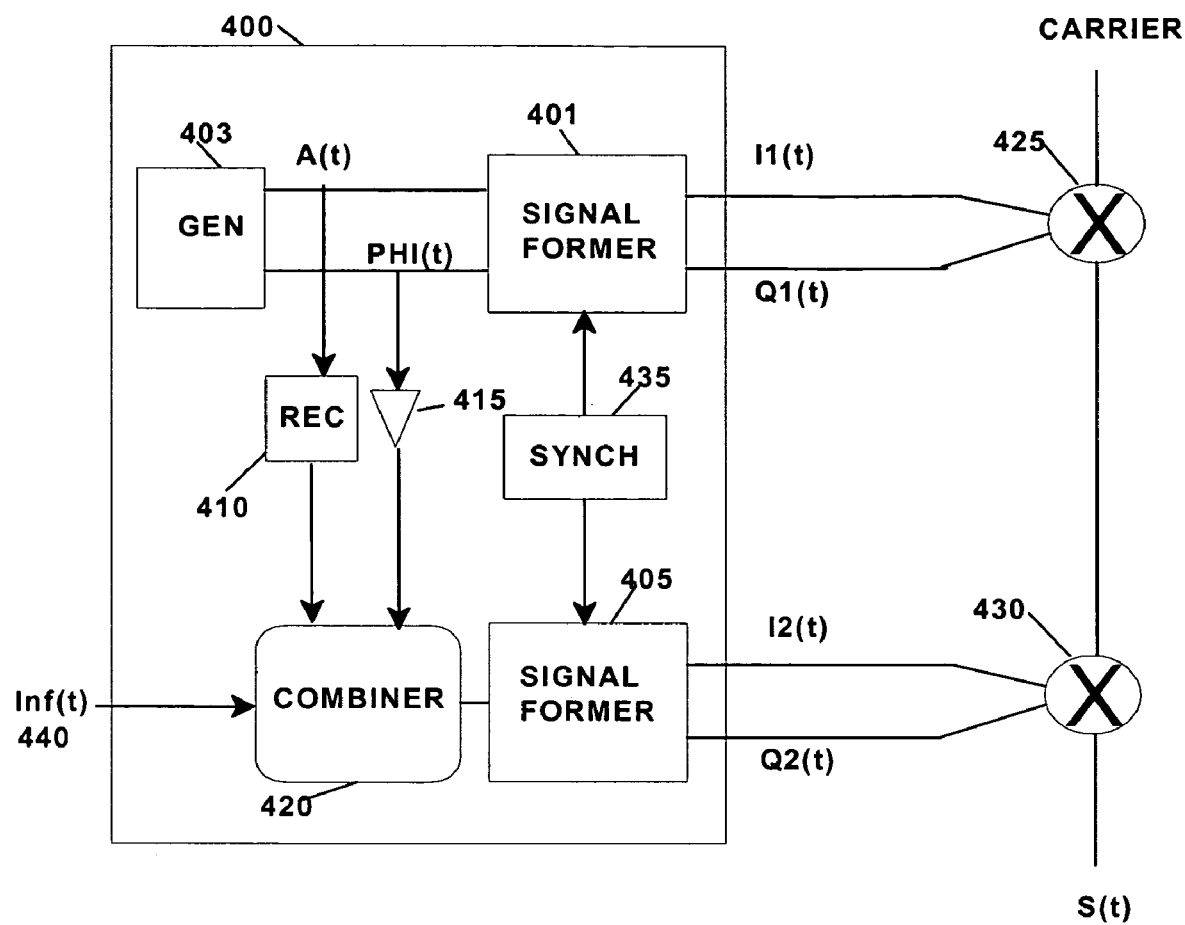
FIG. 4 is a block diagram of one embodiment of a carrier suppression modulator arrangement according to the invention that utilizes pseudo-random type modulating signals.

There is shown in FIG. 4, a carrier suppression modulator illustrative of the invention in which a non-pseudo-random modulating signal is applied to a first of a pair of modulators and the product of the reciprocal of the non-zero pseudo-random modulating signal and an analog information signal is applied as the modulating signal of a second of the modulator pair. As in the carrier suppression arrangement of FIG. 2, the carrier suppression of the first modulator is enhanced by the further carrier suppression of the second modulator and the second modulator output has an extremely suppressed carrier reduced by a factor of 2 on a logarithmic scale relative to single modulator suppression with a modulation component that corresponds to the analog information signal. By randomly varying the modulating signals, the signals on each modulator are effectively decorrelated so that the carrier suppression of each individual modulator is improved without a need for precise adjustments.

The carrier suppression modulator of FIG. 4 has quadrature amplitude modulators 425 and 430 and an encoder 400. In the encoder 400, there is a pseudo-random signal generator 403, a reciprocal forming circuit 410, a phase negating circuit 415, a combiner circuit 420 and signal formers 401 and 405. In operation, a carrier signal is coupled to a carrier input of the modulator 425 and an information signal Inf(t) 440 is coupled to the input of the encoder 400. The output of the modulator 425 is coupled to the carrier input of the modulator 430 and the output of the modulator 430 provides a carrier suppressed modulated signal S(t). The pseudo-random signal generator 403 generates a non-zero pseudo-random signal A(t) and a pseudo-random phase signal φ(t). Signals A(t) and φ(t) are applied to signal former 401 which forms the in-phase and the quadrature phase signals as follows:

$$I1(t) = A(t)\cos\phi(t) \text{ and}$$

$$Q1(t) = A(t)\sin\phi(t).$$

The I1(t) and Q1(t) signals are supplied to the I and Q modulating signal inputs of the first modulator 425.

The combiner 420 receives the information signal Inf(t), a signal 1/A(t) from the reciprocal circuit 410 and a signal −φ(t) from phase negating circuit 415. These signals are combined to form a product signal (inf(t))(−φ(t))/A(t) which is received by the signal former 405. The outputs of the signal former 405 are as follows:

$$I2(t) = [Inf(t)][1/A(t)]\cos(-\phi(t))$$

$$Q2(t) = [Inf(t)][1/A(t)]\sin(-\phi(t)).$$

For digital high speed implementation, a synchronizer 435 operates to synchronize or re-clock the outputs of signal formers 401 and 405 so that at any instant of time, the I1(t), Q1(t) signals from the signal former 401 are simultaneous with the corresponding I2(t), Q2(t) signals from the signal former 405 whereby the output of modulator 430 corresponds to the information signal Inf(t). The modulator 430 receives the modulating signals I2(t) and Q2(t) as its modulating signals and the output of the modulator 425 at its carrier input. The reciprocal modulating signal at modulator 430 operates to cancel the modulation component of the output of the modulator 425 corresponding to the non zero pseudo-random signal applied thereto and produces a suppressed carrier modulated signal S(t) corresponding to the information signal Inf(t). The information signal may be of any form, e.g., an analog signal or a QAM signal.

Figure 5:
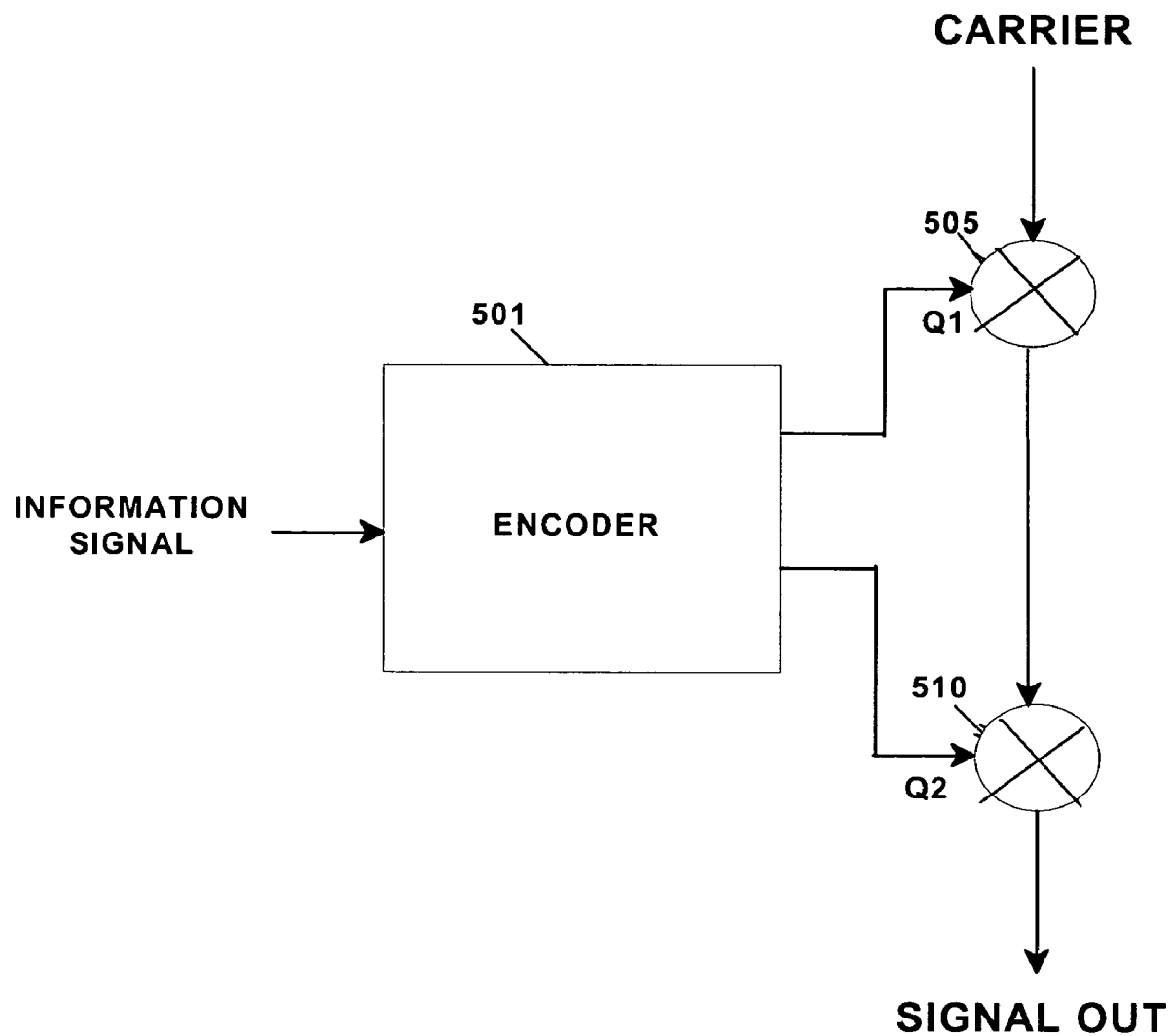
FIG. 5 is a general block diagram of a carrier suppressed BPSK modulator illustrative of the invention.

FIG. 5 shows a block diagram of a carrier suppression modulator for a BPSK information signal in accordance with the invention. As is well known, the output of a BPSK modulator has two 180 degree out-of-phase outputs. One output phase corresponds to a "1" and the other output phase corresponds to "–1". In FIG. 5, there is an encoder 501 and modulators 505 and 510. The encoder 501 operates as a signal former to provide a modulated signal at the output of modulator 510 that corresponds to an input data signal. A carrier signal is applied to the carrier input of the modulator 505. The output of the modulator 505 is coupled to the carrier input of the modulator 510. A digital information signal is applied to the encoder 501 that supplies a modulating signal Q1 to a modulation input of the modulator 505 and a modulating signal Q2 to the modulation input of the modulator 510. In the encoder 501, an input information signal is processed to form a Q1 modulating signal for the modulator 505 and Q2 modulating signal for the modulator 510. In processing the digital information signal, succeeding input information bits of one type generate a varying pattern of Q1 and Q2 signals such that each product of the Q1 and Q2 signals for one information bit corresponds to that information bit. As a result, the modulation component of output of the modulator 505 is modified by the modulator 510 to provide a modulation component corresponding to the information bit.

Figure 6:
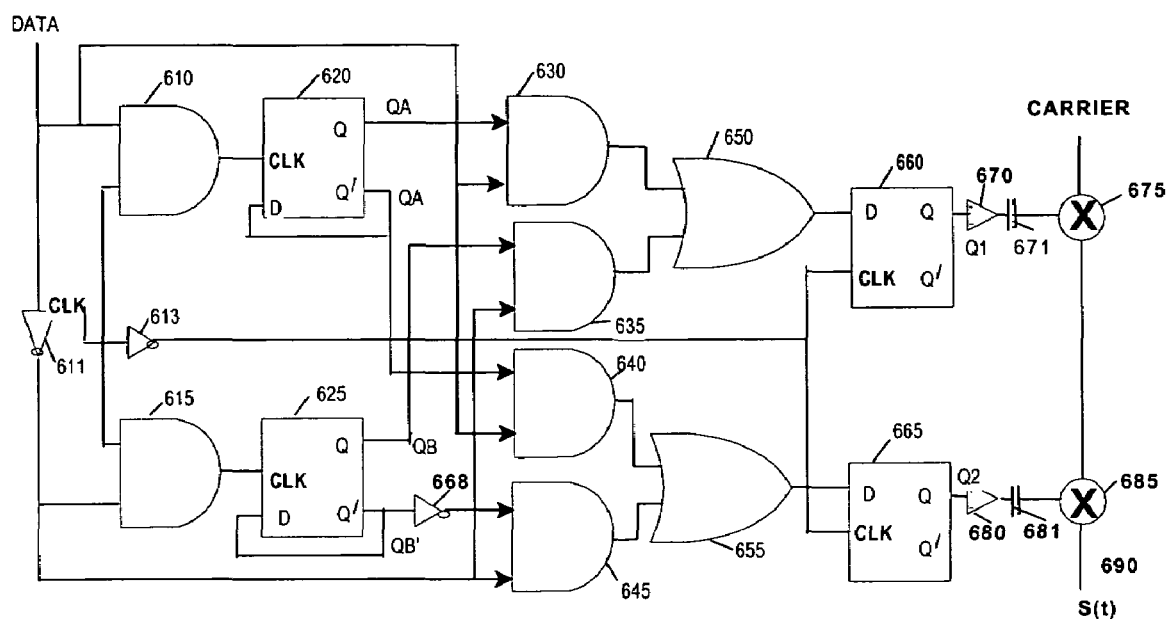
FIG. 6 is a detailed block diagram of one type of carrier suppressed BPSK modulator of FIG. 5.

A detailed block diagram of one embodiment of the a modulator system utilizing the encoder 501 is shown in FIG. 6. The circuit of FIG. 6 operates to provide alternating 1, –1 and 1, 1 modulating signals for succeeding "1" data bits in the information signal and alternating 1, 1 and –1, –1 for succeeding "0" data bits in the information signal. Table 1 indicates the function of the encoder 501 in providing modulating signals Q1 and Q2.

TABLE 1

| DATA | MODULATING SIGNAL Q1 | MODULATING SIGNAL Q2 | OUTPUT SIGNAL |
|---|---|---|---|
| 1 | –1 | 1 | –1 |
| 1 | 1 | –1 | –1 |
| 0 | 1 | 1 | 1 |
| 0 | –1 | –1 | 1 |

As shown in table 1, a binary 0 data input produces a 1 output signal by forming either Q1=1 and Q2=1 modulating signals or Q1=–1 and Q2=–1 modulating signals. A binary 1 data input produces a –1 output signal by forming either Q1=1 and Q2=–1 modulating signals or Q1=–1 and Q2=1 modulating signals. The encoder 501 operates to alternately form Q1=1, Q2=1 and Q1=–1, Q2=–1 modulating signals for succeeding binary 0 data inputs which produces a 1 modulated output from the modulator 510 and operates to alternately form Q1=1, Q2=–1 and Q=–1, Q2=1 modulating signals for succeeding 1 binary data inputs which produces a –1 modulated output from the modulator 510. The alternately formed modulating signals varies the modulation content and thereby decorrelates the modulation to further suppress the carrier component of the output signal from the modulator 510.

Referring to FIG. 6, there are shown D type flip flops 620, 625, 660 and 665, input gates 610 and 615, logic array gates 630, 635, 640, 645, 650 and 655, inverters 611, 613 and 668 and driver amplifiers 670 and 680. As is well known, a D type flip flop changes its state to that of the D input upon being clocked. In response to each "1" data bit at a positive clock transition, gate 610 is enabled and causes flip flop 620 to toggle. Input gate 615 is enabled in response to each "0" data bit at a positive clock transition so that the flip flop 625 is toggled. In the event that a "1" data bit occurs when the QA output of flip flop 620 is a one and the QA' output is a zero, the QA' output of flip flop 620 becomes a one. AND gate 640 is then enabled and AND gates 630 and 635 are inhibited. As a result, flip flop 660 is set in its zero state and the Q1 output becomes "–1". Flip flop 665 is set in its one state by the output of enabled gate 640 and the Q1 output is "1". The next "1" data bit toggles flip flop 620 so that the QA output is a one. AND gate 630 is then enabled while AND gates 640 and 645 are inhibited. Flip flop 660 is then set in its one state by enabled gate 630 through OR gate 650 and the Q1 output is a "1" while flip flop 665 is set in its zero state to produce a "–1" Q2 output.

When a "0" data input bit occurs, flip flop 625 is toggled, e.g., to its one state. AND gate 635 is enabled by the QB output of flip flop 625 and the data. AND gate 645 is enabled by the data input through inverter 611 and the output of inverter 668. As a result, flip flop 660 is set in its one state by the next clock transition through OR gate 650 and flip flop 665 is set in its one state through OR gate 655. The Q1 output becomes a "1" and the Q2 output becomes a "1". In response to the next "0" data bit, flip flop 625 is toggled to its zero state through AND gate 615. AND gates 630 and 640 are inhibited by the "0" data input. AND gate 635 is inhibited by the zero state of flip flop 625 and AND gate 645 is inhibited by the output of inverter 668. In response to no outputs of OR gate 650 and 655, flip flops 660 and 665 are placed in their zero states so that the Q1 output is "–1" and the Q2 output is "–1". In this way, the Q1, Q2 modulating signals for succeeding "1" data bits alternate between 1, –1 and –1,1 and the Q1, Q2 modulating signal for succeeding "0" data bits alternate between 1, 1 and –1, –1.

The clocking of the flip flops 660 and 665 is arranged so that the data at the Q1 output of flip flop 660 and the Q2 output of flip-flop 665 are stable for the duration of high clock pulses and a short period before and after the clock is high. The outputs of flip flops 660 and 665 are coupled to the modulating signal inputs of modulators 675 and 685 through driver amplifiers 670 and 680, respectively. Amplifiers 670 and 680 convert the logic signals Q1 and Q2 into modulator drive signals compatible with the multiplying type modulators 675 and 685 and capacitors 671 and 681 provide AC coupling to the modulating signal inputs of modulators 675 and 685.

Figure 7:
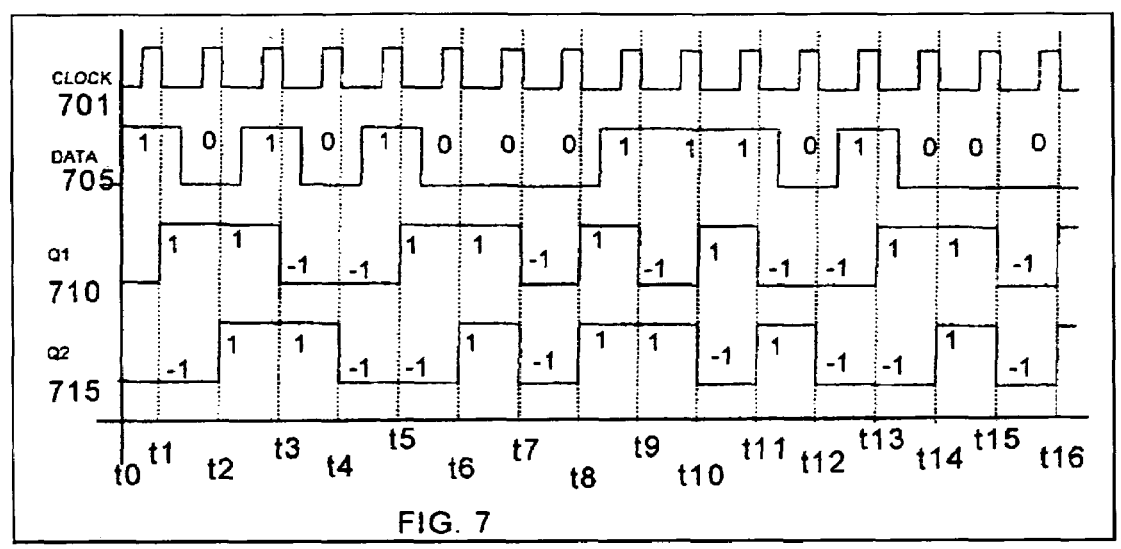
FIG. 7 is a timing diagram illustrating the operation of the carrier suppressed BPSK modulator of FIG. 6.

FIG. 7 is a timing diagram illustrating the operation of the encoder 501 of FIG. 5 as implemented in FIG. 6. As shown in FIG. 7, a "1" data signal 705 between t0 and t1 results in Q1=1, Q2=–1 modulating signals 710 and 715 between t1 and t2. The next "1" data signal 705 between t2 and t3 results in Q1=–1, Q2=1 modulating signals 710 and 715 between t3 and t4 and the succeeding "1" data signal between t4 and t5 results in Q1=1, Q2=–1 modulating signals 710 and 715 between t5 and t6. A "0" data signal 705 between t1 and t2 provides Q1=1, Q2=1 modulating signals 710 and 715 between t2 and t3. The next "0" data signal 705 between t3 and t4 sets Q1=–1, Q2=–1 modulating signals 710 and 715 between t4 and t5 and the succeeding "0" data signal 705 between t5 and t6 sets Q1=1, Q2=1 modulating signals 710 and 715 between t6 and t7. The output of the modulator 685 for 1,1 and –1,–1 modulating signals is a –1 corresponding to a 0 data signal input and the output of the modulator 685 for –1, 1 and 1, –1 modulating signals corresponds to a 1 data signal input. In accordance with the invention, the product of the modulating signals being applied to the series coupled modulators corresponds to the input data signal and the modulating signals for succeeding same bit in the data signal alternates to provide decorrelation of the modulating signals to improve carrier suppression of the series coupled modulators.

In accordance with the invention, each modulating signal Q1 and Q2 may have a zero value DC component while the output signal has a non-zero value. As shown in FIG. 7, the Q1 signal 710 alternates between 1,−1 states and −1,1 states starting from the even clock cycles. Similarly, the Q2 signal 715 alternates between the 1,−1 and −1,1 states starting after odd clock cycles. This BIPHASE-L type of encoding assures a zero DC value for Q1 and Q2 so that they may be AC coupled through capacitors 671 and 681 into the modulators 675 and 685 to prevent any carrier increase due to DC offsets in the modulating signal drivers 670 and 680 even though the resultant output modulated signal may have a non-zero, DC or carrier component.

Figure 8:
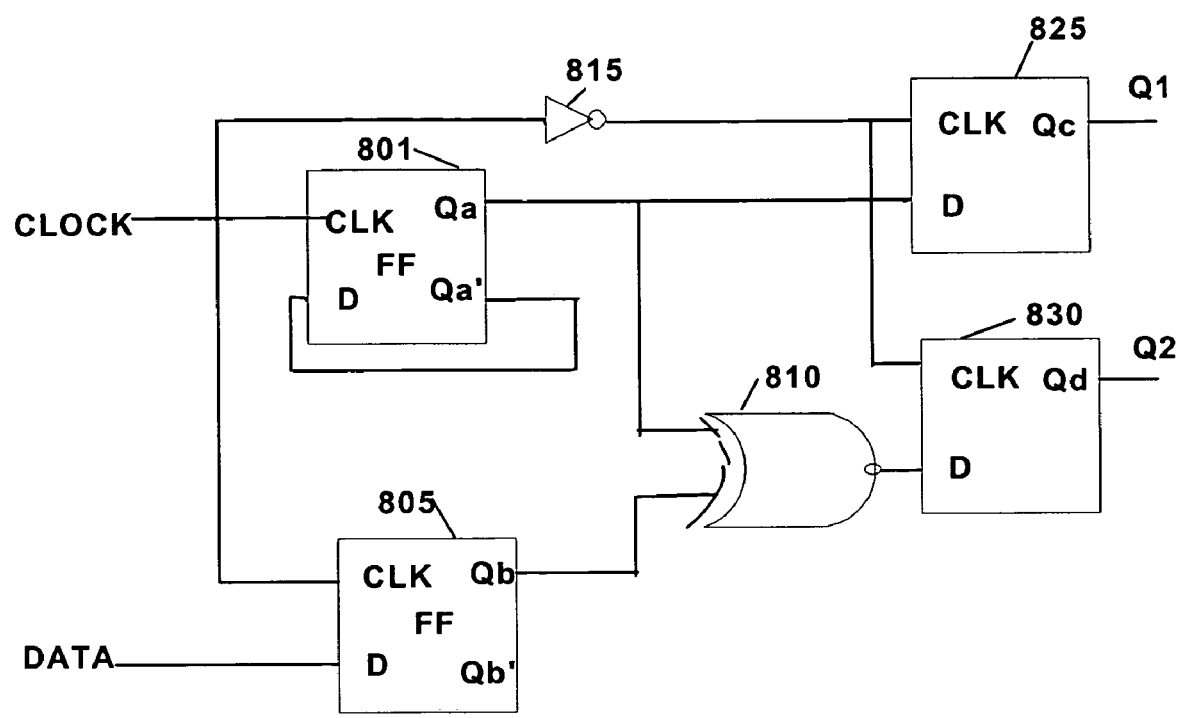
FIG. 8 is a detailed block diagram of a type of encoder for the carrier suppressed BPSK modulator of FIG. 5.

Another type of encoder for the BPSK carrier suppression modulator that may be used for the BPSK carrier suppression modulator of FIG. 5 is shown in FIG. 8. In FIG. 8, there are D type flip flops 801 and 805 and an exclusive nor gate 810. The flip flop 801 has a clock input. A Qa' output of the flip flop 801 is coupled to its D input so that the flip flop 801 toggles at each positive clock transition. The Qa output of Flip flop 801 provides the Q1 modulating signal for the modulator 505 of FIG. 5. The flip flop 805 receives a data signal at its D input so that the Qb output of the flip flop 805 is clocked by the clock positive transition to follow the data signal applied to its D input. The exclusive NOR gate 810 operates to provide a Q2="1" modulating signal when the Qa input from the flip flop 801 is the same as the Qb input from the flip flop 805 and to provide a Q2="−1" modulating signal when the Qa input from the flip flop 801 is different from the Qb input from the flip flop 805.

The output Qa from flip flop 801 is applied to the D input of a flip flop 825 and the output of the exclusive NOR circuit 810 is applied to the D input of a flip flop 830. The clock inputs to the flip flops 825 and 830 are supplied through the inverter 815. The Q1 and Q2 outputs of the flip flops 825 and 830 are then supplied to the modulating signal inputs of the modulators 505 and 510 in FIG. 5. Flip flops 825 and 830 and the inverter 815 operate to synchronize the Q1 and Q2 modulating signals so that the Q1 and Q2 data are stable for the duration of the high clock signal and short intervals before and after the high clock signal. At higher frequencies where the exclusive NOR gate 810 propagation delays become significant, the delay between the Q1 and Q2 modulating signals can create out-of-band energy to reduce the modulator effectiveness. By reclocking with flip flops 825 and 830, the timing errors between the Q1 and Q2 modulating signals are minimized.

The operation of the encoder of FIG. 8 is illustrated in Table 2.

TABLE 2

| | TIME | | | | | | | | | |
|---|---|---|---|---|---|---|---|---|---|---|
| | 1 | 2 | 3 | 4 | 5 | 6 | 7 | 8 | 9 | 10 |
| DATA | 1 | 0 | 1 | 1 | 0 | 0 | 0 | 1 | 1 | 1 |
| Q1 | 1 | −1 | 1 | −1 | 1 | −1 | 1 | −1 | 1 | −1 |
| Q2 | 1 | 1 | 1 | −1 | −1 | 1 | −1 | −1 | 1 | −1 |
| OUT | 1 | −1 | 1 | 1 | −1 | −1 | −1 | 1 | 1 | 1 |

Referring to Table 2, there is shown an example of a modulating signal sequence for DATA for TIME periods 1 through 10. The Q1 modulating signal corresponds to the toggling output Qa from the flip flop 801 and the Q2 modulating signal corresponds to the output of the exclusive NOR gate 810. In the time period 1, the data signal is "1" and the Qa output of the flip flop 801 is 1. Since both the data and the Q1 inputs to the exclusive NOR gate 810 are the same, the Q2 modulating signal is "1" and the output of the modulator 510 which corresponds to the product of Q1 and Q2 is "1". In the time period 2, the data signal is "0" and the Qa output of the flip flop is "0" so that the Q1 modulating signal is "−1". The data signal and the Qa output are different whereby the Q2 modulating signal is "−1". As is readily seen from Table 2, the Q1 modulating signals for succeeding "1"s in the data signal and for succeeding "0"s in the data signal vary according to the state of the Qa output of the flip flop 801 while the Q2 modulating signals for succeeding "1"s in the data signal and for succeeding "0"s in the data signal vary based on the state of the toggling flip flop 801. In each time period, however, the product of the Q1 and the Q2 modulating signals corresponds to the input data signal.

Figure 9:
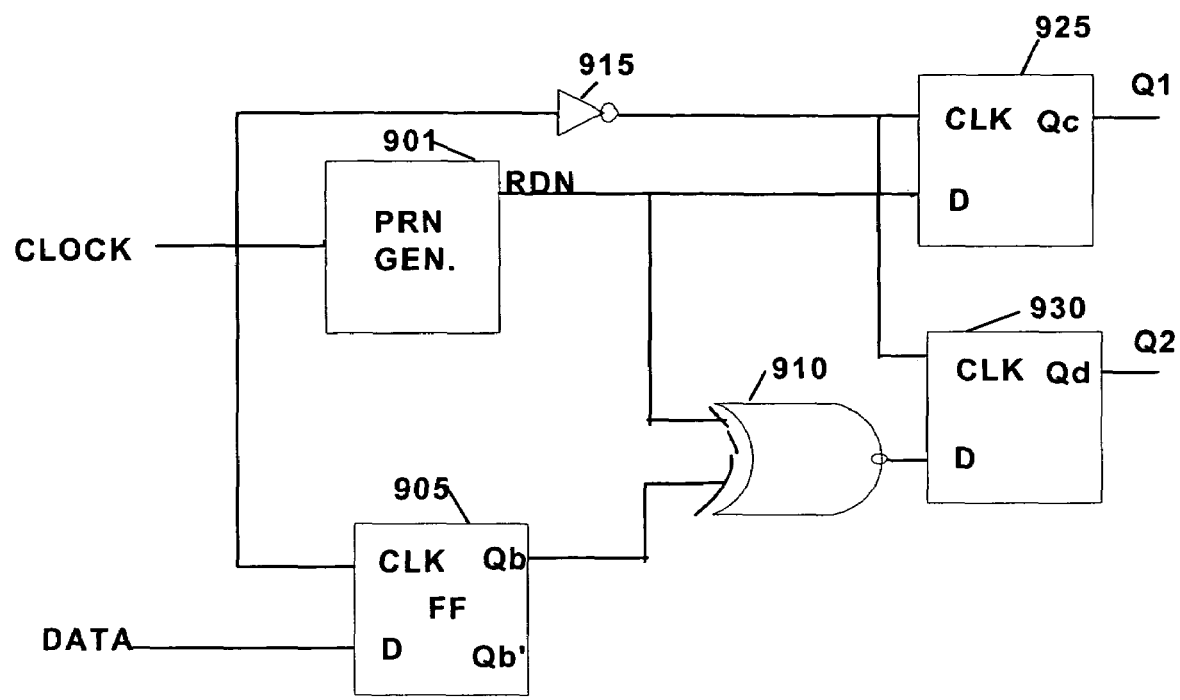
FIG. 9 is a detailed block diagram of another type of encoder for the carrier suppressed BPSK modulator of FIG. 5.

In FIG. 9, there is shown another encoder arrangement for the BPSK modulator of FIG. 5 in which a pseudo-random number generator is substituted for the toggling flip flop 801 of FIG. 8. Referring to FIG. 9, a pseudo-random number generator 901 receives a clock input and provides a random output RDN and a D type flip flop 905 receives a clock input and a data signal at its D input. The Qb output of the flip flop 905 is applied to one input of an Exclusive NOR gate 910 and the Exclusive NOR gate receives another input from the pseudo-random number generator 901. The exclusive NOR gate 910 operates to form a "1" when its pseudo-random number and data inputs are the same and to form a "−1" when its pseudo-random number and data inputs are different so that the product of the Q1 and Q2 modulating signals to be applied to the modulators 505 and 510 in FIG. 5 always corresponds to the input data signal. As described with respect to FIG. 8, the modulating signals for succeeding "1"s and the modulating signals for succeeding "−1"s vary, but pseudo-randomly rather than according to a toggling flip flop.

The output RDN from pseudo-random number generator 901 is applied to the D input of a flip flop 925 and the output of the exclusive NOR circuit 910 is applied to the D input of a flip flop 930. The clock input to the flip flops 925 and 930 is supplied through the inverter 915. The Q1 and Q2 outputs of the Flip flops 925 and 930 are then supplied to the modulating signal inputs of the modulators 505 and 510 in FIG. 5. Flip flops 925 and 930 and the inverter 915 operate as described with respect to FIG. 8 to synchronize the Q1 and Q2 modulating signals to compensate for exclusive NOR gate 910 delays so that the Q1 and Q2 data are stable for the duration of the high clock signal and short intervals before and after the high clock signal at higher frequencies.

Figure 10:
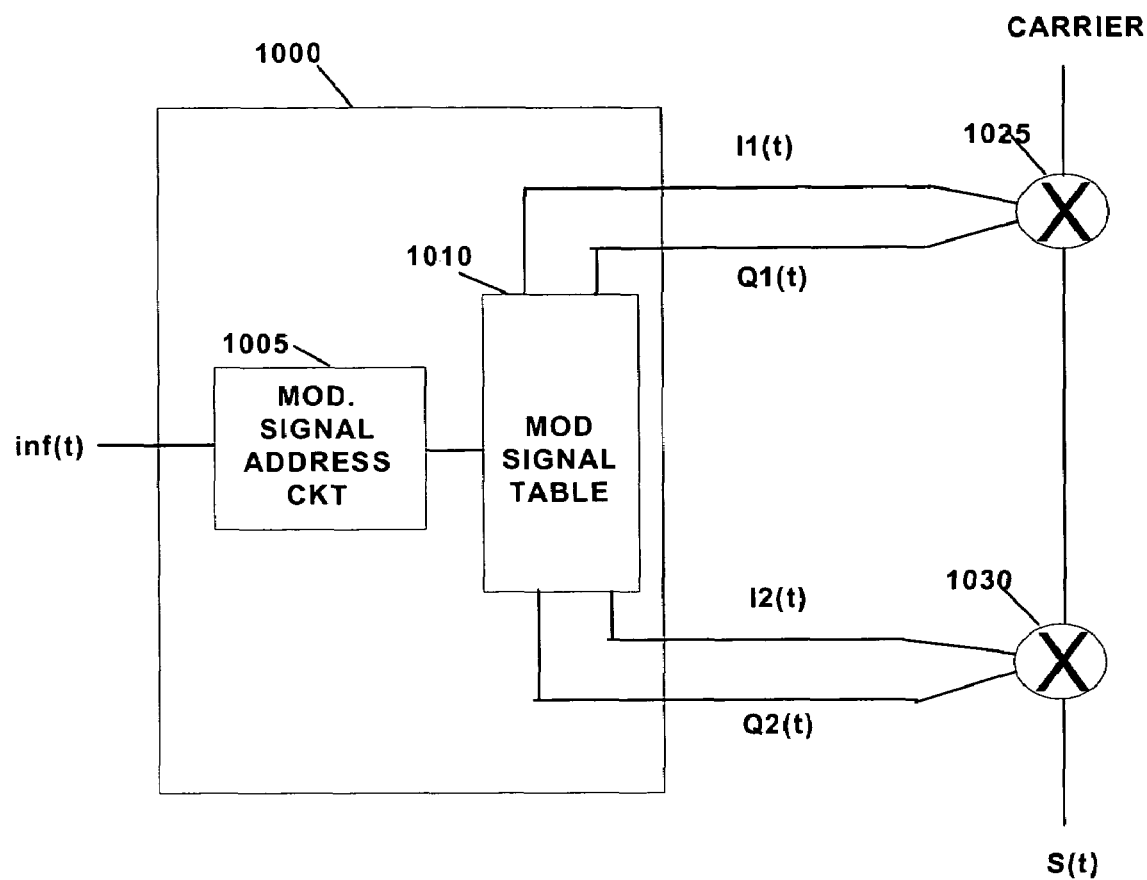
FIG. 10 is a general block diagram of a carrier suppressed quadrature phase shift keying (QPSK) modulator.

A suppressed carrier QPSK modulator according to the invention is shown in FIG. 10. In FIG. 10, there are serially coupled carrier suppression type modulators 1025 and 1030 and an encoder 1000. In the signal former type encoder 1000, there is a modulator signal address circuit 1005 and a modulator signal table 1010. A carrier is supplied to a carrier input of the modulator 1025. An in-phase modulating signal I1(t) and a quadrature-phase signal Q1(t) are applied to the in-phase and quadrature phase inputs of the modulator 1025 from the encoder 1000. The output signal from the modulator 1025 is coupled to the carrier input of the modulator 1030 and the modulator 1030 receives an in-phase modulating signal I2(t) and a quadrature-phase modulating signal Q2(t) at its modulating signal inputs.

The encoder 1000 operates to convert a QPSK information signal Inf(t) which has an in-phase component I(t) and a quadrature-phase component Q(t) into the modulating signals I1(t), Q1(t), I2(t) and Q2(t). The conversion in the encoder 1000 is arranged so that succeeding occurrences of a given input symbol provides a varying modulating signal for each of the modulators 1025 and 1030. A modulator signal address circuit 1005 receives the successive I,Q data bits of the information signal and the modulator signal table 1010 is addressed by the modulator signal address circuit 1005 to provide the different modulating signals for the modulator 1025 and the modulator 1030. The varying modulating signals I1(t), Q1(t), I2(t) and Q2(t) for same symbol sets decorrelates the DC offsets in the modulators and enhances carrier suppression. Table 3 shows an example of the modulator signal table.

TABLE 3

| INPUT I, Q | n | MOD 1 I1 | MOD 1 Q1 | MOD 2 I2 | MOD 2 Q2 | OUT I | OUT Q |
|---|---|---|---|---|---|---|---|
| −1, −1 | n1 = 1 | 1 | 1 | −1 | −1 | −1 | −1 |
| −1, −1 | n1 = 2 | −1 | 1 | 1 | −1 | −1 | −1 |
| −1, −1 | n1 = 3 | 1 | −1 | −1 | 1 | −1 | −1 |
| −1, −1 | n1 = 4 | −1 | −1 | 1 | 1 | −1 | −1 |
| −1, 1 | n2 = 1 | −1 | 1 | 1 | 1 | −1 | 1 |
| −1, 1 | n2 = 2 | −1 | −1 | 1 | −1 | −1 | 1 |
| −1, 1 | n2 = 3 | 1 | 1 | −1 | 1 | −1 | 1 |
| −1, 1 | n2 = 4 | 1 | −1 | −1 | −1 | −1 | 1 |
| 1, −1 | n3 = 1 | 1 | 1 | 1 | −1 | 1 | −1 |
| 1, −1 | n3 = 2 | 1 | −1 | 1 | 1 | 1 | −1 |
| 1, −1 | n3 = 3 | −1 | 1 | −1 | −1 | 1 | −1 |
| 1, −1 | n3 = 4 | −1 | −1 | −1 | 1 | 1 | −1 |
| 1, 1 | n4 = 1 | 1 | 1 | 1 | 1 | 1 | 1 |
| 1, 1 | n4 = 2 | −1 | 1 | −1 | 1 | 1 | 1 |
| 1, 1 | n4 = 3 | 1 | −1 | 1 | −1 | 1 | 1 |
| 1, 1 | n4 = 4 | −1 | −1 | −1 | −1 | 1 | 1 |

The "INPUT" column of table 3 lists the possible values for each symbol of the input I, Q data symbols of the information signal. The column "n" identifies the several sets of I1, Q1 and I2, Q2 symbols of the modulating signals for each input symbol. The four "n1" rows identify the I1, Q1 and I2, Q2 modulating signals that provide a modulated output from the modulator 1030 corresponding to the information signal I=−1, Q=−1. The four "n2" rows identify the I1, Q1 and I2, Q2 symbols that provide a modulated output from the modulator 1030 corresponding to the information signal I=−1, Q=1. The four "n3" rows identify the I1, Q1 and I2, Q2 symbols that provide a modulated output from the modulator 1030 corresponding to the information signal I=1, Q=−1 and the four "n4" rows identify the I1, Q1 and I2, Q2 symbols that provide a modulated output from the modulator 1030 corresponding to the information signal I=1, Q=1. The modulating signals for each "n" address are selected so that the product of the in-phase modulating signals corresponds to the in-phase component of the input information signal and the product of the quadrature phase modulating signals corresponds to the quadrature phase component of the information signal.

Figure 11:
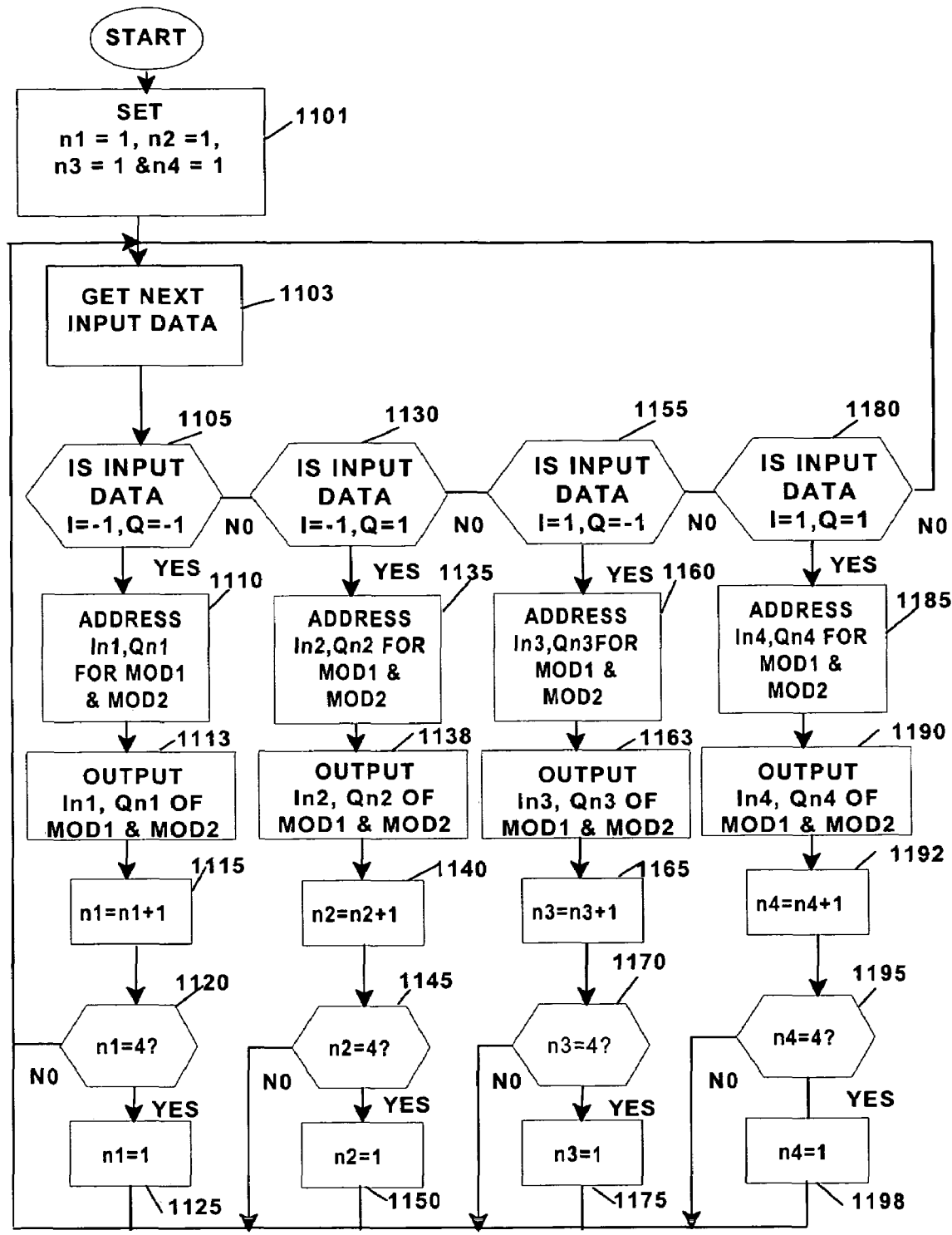
FIG. 11 is a flow chart illustrating the operation of the carrier suppressed QPSK modulator of FIG. 10 wherein a rotating sets of modulating signals are formed for input data.

FIG. 11 is a flow chart that illustrates the operation of one type of encoder 1000 in FIG. 10. Referring to FIG. 11, the symbol address indices n1, n2, n3 and n4 in the modulating signal address circuit 1005 are initially set to 1 in a step 1101 and the next information signal input data is obtained by the modulating signal address circuit 1005 in a step 1103. When the input data is I=−1, Q=−1, a step 1110 is entered from the step 1103 through a decision step 1105. In the step 1110 for n1=1, the symbols I1=1, Q1=1, I2=−1 and Q2=−1 in the modulating signal table are addressed and are output to the modulators 1025 and 1030 in a step 1113. n1 is incremented in a step 1115 and the step 1103 is reentered though a decision step 1120. If n1=4, n1 is reset to 1 in a step 1125 before the step 1103 is reentered. As a result, a different one of the four sets of I1, Q1, I2 and Q2 symbols is selected for each occurrence of an I=−1, Q=−1 input data symbol set and these symbol sets from the modulating signal table 1010 are applied in rotating order as modulating signals for succeeding I=−1, Q=−1 input data symbol sets. The product of (I1)(I2) for each of modulating signals of the set for n1 is −1 corresponding to the input data in-phase I symbol and the product (Q1)(Q2) for each of the modulating signals of the set for n1 is −1 corresponding to the input data quadrature phase Q symbol.

When the input data is I=−1, Q=1, a step 1135 is entered from the step 1103 through a decision step 1130. In the step 1135 for n2=1, the symbols I1=−1, Q1=1, I2=1 and Q2=1 in the modulating signal table are addressed and are output to the modulators 1025 and 1030 in a step 1138. n2 is incremented in a step 1140 and the step 1103 is reentered though a decision step 1145. If n2=4, it is reset to 1 in a step 1150 before the step 1103 is reentered. As a result, a different one of the four sets of I1, Q1, I2 and Q2 symbols is selected for each occurrence of an I=−1, Q=1 input data symbol set and these symbol sets from the modulating signal table 1010 are applied in rotating order as modulating signals for succeeding I=−1, Q=1 input data symbol sets. The product of (I1)(I2) for each of modulating signals of the set for n2 is −1 corresponding to the input data in-phase I symbol and the product (Q1)(Q2) for each of the modulating signals of the set for n2 is 1 corresponding to the input data quadrature phase Q symbol.

When the input data is I=1, Q=−1, a step 1160 is entered from the step 1103 through a decision step 1155. In the step 1160 for n3=1, the data symbols I1=1, Q1=1, I2=1 and Q2=−1 in the modulating signal table are addressed and are output to the modulators 1025 and 1030 in a step 1163. n3 is incremented in a step 1165 and the step 1103 is reentered though a decision step 1170. If n3=4, it is reset to 1 in a step 1175 before the step 1103 is reentered. As a result, a different one of the four sets of I1, Q1, I2 and Q2 symbols is selected for each occurrence of an I=1, Q=−1 input data symbol set and these symbol sets from the modulating signal table 1010 are applied in rotating order as modulating signals for succeeding I=1, Q=−1 input data symbols. The product of (I1)(I2) for each of modulating signals of the set for n3 is 1 corresponding to the input data in-phase I symbol and the product (Q1)(Q2) for each of the modulating signals of the set for n3 is −1 corresponding to the input data quadrature phase Q symbol.

When the input data is I=1, Q=1, a step 1185 is entered from the step 1103 through a decision step 1180. In the step 1185 for n4=1, the data symbols I1=1, Q1=1, I2=1 and Q2=1 in the modulating signal table are addressed and are output to the modulators 1025 and 1030 in a step 1190. n4 is incremented in a step 1192 and the step 1103 is reentered though a decision step 1195. If n4=4 in a step 1195, it is reset to 1 in a step 1198 before the step 1103 is reentered. As a result, a different one of the four sets of I1, Q1, I2 and Q2 symbols is selected for each occurrence of an I=1, Q=1 input data symbol set and these symbol sets from the modulating signal table 1010 are applied in rotating order as modulating signals for succeeding I=1, Q=1 input data symbol sets. The product of (I1)(I2) for each of modulating signals of the set for n4 is 1 corresponding to the input data in-phase I symbol and the product (Q1)(Q2) for each of the modulating signals of the set for n4 is 1 corresponding to the input data quadrature phase Q symbol.

Figure 12:
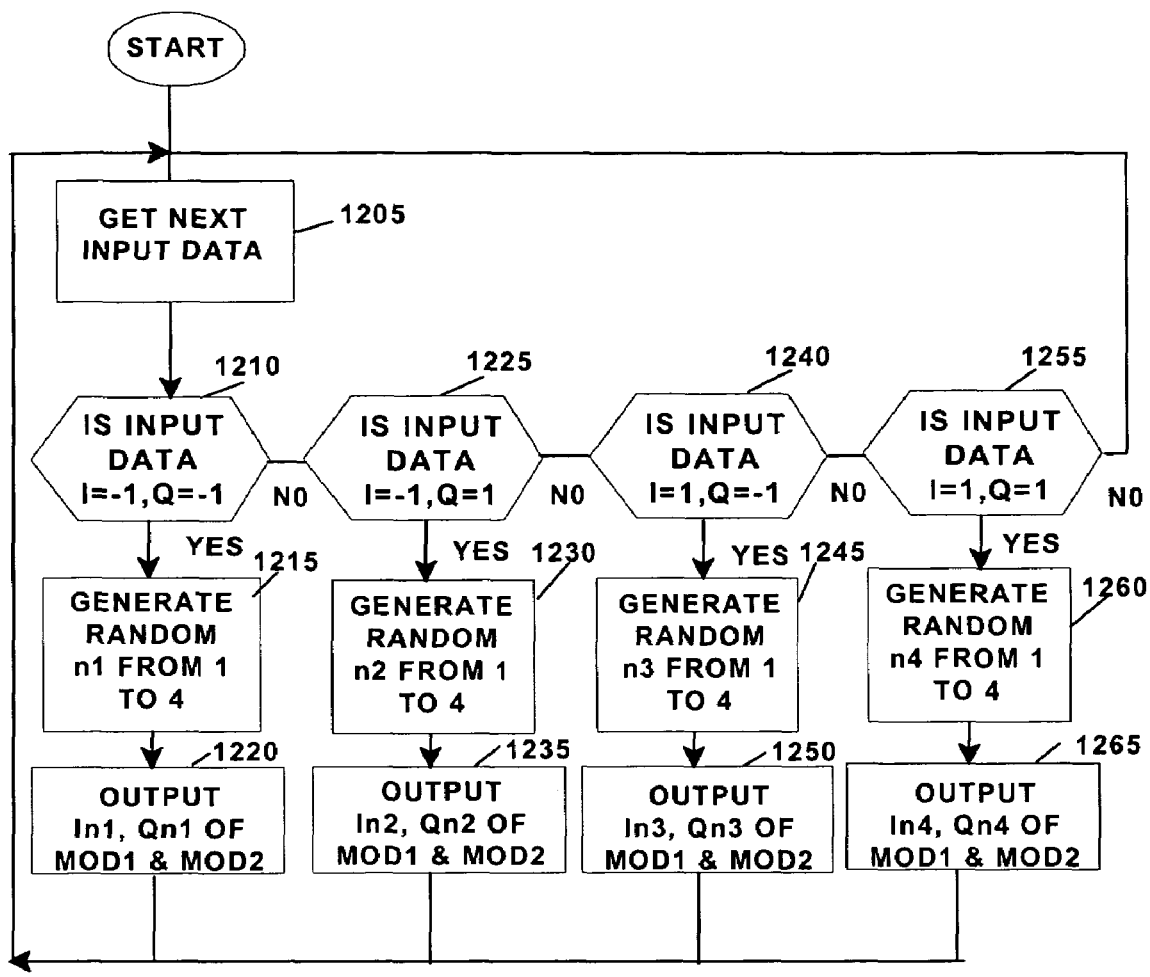
FIG. 12 is a flow chart illustrating the operation the carrier suppressed QPSK modulator of FIG. 10 in wherein modulating signals for input data are randomly selected.

FIG. 12 is a flow chart illustrating the operation of another type of circuit that may be used as the encoder 1000 in which the modulator signal address circuit 1005 utilizes a random number generator to address the modulating signal table 1010. In FIG. 12, the modulator signal address circuit 1005 receives the next input data symbol set from the information signal Inf(t) in a step 1205. If the input data symbol set is I=−1, Q=−1, a step 1215 is entered from the step 1205 through a decision step 1210. In the step 1215, a pseudorandom number from 1 to 4 is generated for the addressing index n1 and a corresponding set of modulating signals is selected from the modulating signal table 1010. For n1=2, for example, the symbol set I1=−1, Q1=1, I2=1 and Q2=−1 is selected in the table 1010, the modulating signals I1=−1, Q1=1 are applied to the modulator 1025 and the modulating signal I2=1 and Q2=−1 are applied to the modulator 1030 in FIG. 10 in a step 1220. Control is then returned to the step 1205 to process the next input data symbol set.

When the next input data symbol set is I=−1, Q=1, a pseudo-random number generating step 1230 is entered from the step 1205 through a decision step 1225. In the step 1230, a pseudo-random number from 1 to 4 is generated for the addressing index n2 and a corresponding set of modulating signals is selected from the modulating signal table 1010. For n2=3, for example, the symbol set I1=1, Q1=1, I2=−1 and Q2=1 is selected in the table 1010, the modulating signals I1=−1, Q1=1 are applied to the modulator 1025 and the modulating signals I2=−1 and Q2=−1 are applied to the modulator 1030 in FIG. 10 in a step 1235. Control is then returned to the step 1205 to process the next input data symbol set.

Upon receipt of a data symbol set I=1, Q=−1 by the modulator signal address circuit 1005, a pseudo-random number generating step 1245 is entered from the step 1205 through a decision step 1240. In the step 1245, a pseudo-random number from 1 to 4 is generated for the addressing index n3 and a corresponding set of modulating signals is selected from the modulating signal table 1010. For n3=4, for example, the symbol set I1=−1, Q1=−1, I2=−1 and Q2=1 is selected in the table 1010, the modulating signals I1=−1, Q1=−1 are applied to the modulator 1025 and the modulating signal I2=−1 and Q2=1 are applied to the modulator 1030 in FIG. 10 in a step 1250. Control is then returned to the step 1205 to process the next input data symbol set.

If the an input data symbol set received by the modulator address circuit 1005 is I=1, Q=1, a pseudo-random number generating step 1260 is entered from the step 1205 through a decision step 1255. In the step 1260, a pseudo-random number from 1 to 4 is generated for the addressing index n4 and a corresponding set of modulating signals is selected from the modulating signal table 1010. For n4=1, for example, the symbol set I1=1, Q1=1, I2=1 and Q2=1 is selected in the table 1010, the modulating signals I1=1, Q1=1 are applied to the modulator 1025 and the modulating signal I2=1 and Q2=1 are applied to the modulator 1030 in FIG. 10 in a step 1265. Control is then returned to the step 1205 to process the next input data symbol set.

In the modulating signal table 1010, The product of the I1 and I2 modulating signals for each n indexed set of modulating signals corresponds to the I component of the information signal and the product of the Q1 and Q2 modulating signals for each n indexed set of modulating signals corresponds to the Q component of the information signal. Accordingly, the modulation component of the output of the modulator 1030 corresponds to the information signal and the carrier applied to the carrier input of the modulator 1025 is successively suppressed in the modulators 1025 and 1030.

Since the modulating signals formed in the operation of the encoder according to FIG. 12 are randomly selected, the offsets that occur among the modulating signals in the modulators 1025 and 1030 are decorrelated to further suppress the carrier in the circuit of FIG. 10.

While the invention has been described by way of particular illustrative embodiments, it may be utilized at any frequency across the electromagnetic RF and optical spectrum, for acoustic or elastic waves or in any other wave propagation type medium. For example, it may be implemented in systems where carrier suppressed modulation is needed such as for systems where transmissions are limited in power density by regulation, in sideband modulators and demodulators, in code division multiple access systems, in spread spectrum systems, in optical systems requiring coherence reduction or wavelength multiplexing, in optical frequency translation arrangements, in direct modulation or direct demodulation systems and for frequency plans requiring reduction of spurious and/or intermodulation products. It is therefore to be understood that the invention is not limited to the above-described embodiments but that those of ordinary skill in the art may make various changes and modifications without departing from the scope and spirit of the invention. Accordingly, the foregoing embodiments should not be construed as limiting the scope of the invention, which is encompassed instead by the following claims.

What is claimed is:

1. Apparatus for modulating a carrier with an information signal, comprising:
a plurality of serially coupled modulators, each including a carrier input, a modulating signal input and a modulated carrier output, a carrier being coupled to the carrier input of a first of the serially coupled modulators and the modulated carrier output of each modulator being coupled to the carrier input of a succeeding modulator; and
an encoder responsive to the information signal for generating modulating signals to be applied to the modulating signal inputs of the serially coupled modulators, such that a product of the modulating signals forms the information signal,
wherein, the modulating signals applied to each modulator of the serially coupled modulators modify the modulated carrier output received at the carrier input of the respective modulator to produce a carrier suppressed information signal modulated output at the last of the serially coupled modulators.

2. Apparatus for modulating a carrier according to claim 1, wherein the modulating signals applied to one of the plurality of serially coupled modulators produce a modulation component in the modulator output of the one of the serially coupled modulators that substantially removes a modulating component produced by a preceding modulator of the plurality of serially coupled modulators and the modulating signals applied to any one of the plurality of serial coupled modulators also includes the information signal.

3. Apparatus for modulating a carrier according to claim 2, wherein the plurality of serially coupled modulators includes first and second modulators, the modulating signal applied to one of the first and second modulators includes a component that is a reciprocal of the modulating signal applied to the other of the first and second modulators.

4. Apparatus for modulating a carrier according to claim 3, wherein the information signal is an analog signal.

5. Apparatus for modulating a carrier according to claim 3, wherein the information signal is a QAM signal.

6. Apparatus for modulating a carrier according to claim 3, wherein the modulating signal applied to the first modulator is a pseudo-random signal.

7. Apparatus for modulating a carrier according to claim 3, wherein the modulating signal applied to the first modulator is a periodically varying signal.

8. Apparatus for modulating a carrier according to claim 1, wherein the plurality of serially coupled modulators includes first and second modulators that perform binary phase shift keying, the modulating signals applied to the first and second modulators for succeeding "one" symbols in the information signal alternate between (1,−1) and (−1,1) and the modulating signals applied to the first and second modulators for succeeding "zero" symbols in the information signal alternate between (−1,−1) and (1,1).

9. Apparatus for modulating a carrier according to claim 1, wherein the plurality of serially coupled modulators includes first and second modulators that perform binary phase shift keying, the modulating signals applied to the first and second modulators (Q1, Q2) for succeeding "one" symbols in the information signal randomly vary between (1,−1) and (−1,1) and the modulating signals applied to the first and second modulators for succeeding "zero" symbols in the information signal randomly vary between (−1,−1) and (1,1).

10. Apparatus for modulating a carrier wave according to claim 1, wherein the plurality of serially coupled modulators includes first and second modulators that perform quadrature phase shift keying, the modulating signals applied to the first and second modulators for succeeding I=−1,Q=−1's in the information signal rotate among I,Qs of (1,1) (−1,−1), (−1,−1) (1,1), (1,−1) (−1,1), (−1,−1) (1,1), the modulating signals applied to the first and second modulators for succeeding I=−1,Q=1's in the information signal rotate among I,Qs of (−1,1) (1,1), (−1,−1) (1,−1), (1,1) (−1,1), (1,−1) (−1,−1 ), the modulating signals applied to the first and second modulators for succeeding I=1,Q=−1's in the information signal rotate among I,Qs of (1,1) (1,−1), (1,−1) (1,1), (−1,1) (−1,−1), (−1,−1) (−1,1) and the modulating signals applied to the first and second modulators for succeeding I=1,Q=1's in the information signal rotate among I,Qs of (1,1) (1,1), (−1,1) (1,1), (−1,1) (−1,1), (1,−1 ) (1,−1).

11. Apparatus for modulating a carrier wave according to claim 1, wherein the plurality of serially coupled modulators includes first and second modulators that perform quadrature phase shift keying, the modulating signals applied to the first and second modulators for succeeding I=−1,Q=−1's in the information signal are randomly selected among I,Qs of (1,1) (−1,−1), (−1,−1) (1,1), (1,−1) (−1,1), (−1,−1) (1,1), the modulating signals applied to the first and second modulators for succeeding I=−1,Q=1's in the information signal are randomly selected among I,Qs of (−1,1) (1,1), (−1,−1) (1,−1), (1,1) (−1,1), (1,−1) (−1,−1), the modulating signals applied to the first and second modulators for succeeding I=1,Q=−1's in the information signal are randomly selected among I,Qs of (1,1) (1,−1), (1,−1) (1,1), (−1,1) (−1,−1), (−1,−1) (−1,1), and the modulating signals applied to the first and second modulators for succeeding I=1,Q=1's in the information signal are randomly selected among I,Qs of (1,1) (1,1), (−1,1) (1,1), (−1,1) (−1,1), (1,−1)(1,−1).

12. Apparatus for modulating a carrier wave according to claim 1, wherein the plurality of serially coupled modulators includes first and second modulators that perform quadrature phase shift keying, the modulating signals applied to the first and second modulators for succeeding I=−1,Q=−1's in the information signal are periodically changed among I,Qs of (1,1) (−1,−1), (−1,−1) (1,1), (1,−1) (−1,1), (−1,−1) (1,1), the modulating signals applied to the first and second modulators for succeeding I=−1,Q=1's in the information signal are periodically changed among I,Qs of (−1,1) (1,1), (−1,−1) (1,−1), (1,1) (−1,1), (1,−1) (−1,−1), the modulating signals applied to the first and second modulators for succeeding I=1,Q=−1's in the information signal are periodically changed among I,Qs of (1,1) (1,−1), (1,−1) (1,1), (−1,1) (−1,−1), (−1,−1) (−1,1), and the modulating signals applied to the first and second modulators for succeeding I=1,Q=1's in the information signal are periodically changed among I,Qs of (1,1) (1,1), (−1,1) (1,1), (−1,1) (−1,1), (1,−1) (1,−1).

13. A method of modulating a carrier with an information signal comprising the steps of:
generating a plurality of modulating signals responsive to the information signal such that a product of the modulating signals forms the information signal; and
applying the modulating signals to modulating signal inputs of a plurality of serially coupled modulators each including a carrier input and a modulated carrier output, the modulated carrier output of each modulator being coupled to the carrier input of a succeeding modulator,
wherein, the modulating signals applied to each modulator of the serially coupled modulators modify the modulated carrier output at the carrier input of the respective modulator to produce a carrier suppressed information signal modulated output at the last of the serially coupled modulators.

14. A method of modulating a carrier with an information signal according to claim 13, wherein the modulating signals applied to one of the plurality of serially coupled modulators produce a modulation component in the modulator output of the one of the serially coupled modulators that substantially removes a modulating component produced by a preceding modulator of the plurality of serially coupled modulators and the modulating signals applied to any one of the plurality of serial coupled modulators also includes the information signal.

15. A method of modulating a carrier with an information signal according to claim 14, wherein the plurality of serially coupled modulators includes first and second modulators, wherein the modulating signal applied to one of the first and second modulators includes a component that is a reciprocal of the modulating signal applied to the other of the first and second modulators.

16. A method of modulating a carrier with an information signal according to claim 15, wherein the information signal is an analog signal.

17. A method of modulating a carrier with an information signal according to claim 14, wherein the information signal is a QAM signal.

18. A method of modulating a carrier with an information signal according to claim 14, wherein the modulating signal applied to the first modulator is a pseudo-random signal.

19. A method of modulating a carrier with an information signal according to claim 14, wherein the modulating signal applied to the first modulator is a periodically varying signal.

20. A method of modulating a carrier with an information signal according to claim 13, wherein the plurality of serially coupled modulators includes first and second modulators that perform binary phase shift keying, the modulating signals applied to the first and second modulators (Q1, Q2) for succeeding "one" symbols in the information signal alternate between (1,−1) and (−1,1) and the modulating signals applied to the first and second modulators for succeeding "zero" symbols in the information signal alternate between (−1,−1) and (1,1).

21. A method of modulating a carrier with an information signal according to claim 13, wherein the plurality of serially coupled modulators includes first and second modulators that perform binary phase shift keying, the modulating signals applied to the first and second modulators (Q1, Q2) for succeeding "one" symbols in the information signal randomly vary between (1,−1) and (−1,1) and the modulating signals applied to the first and second modulators for succeeding "zero" symbols in the information signal randomly vary between (−1,−1) and (1,1).

22. A method of modulating a carrier with an information signal according to claim 13, wherein the plurality of serially coupled modulators includes first and second modulators that perform quadrature phase shift keying, the modulating signals applied to the first and second modulators for succeeding I=−1,Q=−1's in the information signal rotate among I,Qs of (1,1) (−1,−1), (−1,−1) (1,1), (1,−1) (−1,1), (−1,−1 ) (1,1), the modulating signals applied to the first and second modulators for succeeding I=−1,Q=1's in the information signal rotate among I,Qs of (−1,1) (1,1), (−1,−1) (1,−1), (1,1) (−1,1), (1,−1) (−1,−1), the modulating signals applied to the first and second modulators for succeeding I=1,Q=−1's in the information signal rotate among I,Qs of (1,1) (1,−1), (1,−1) (1,1), (−1,1) (−1,−1), (−1,−1) (−1,1), and the modulating signals applied to the first and second modulators for succeeding I=1,Q=1's in the information signal rotate among I,Qs of (1,1) (1,1), (−1,1) (1,1), (−1,1) (−1,1), (1,−1) (1,−1).

23. A method of modulating a carrier with an information signal according to claim 13, wherein the plurality of serially coupled modulators comprises first and second modulators that perform quadrature phase shift keying, the modulating signals applied to the first and second modulators for succeeding I=−1,Q=−1's in the information signal are randomly selected among I,Qs of (1,1) (−1,−1), (−1,−1) (1,1), (1,−1) (−1,1), (−1,−1) (1,1), the modulating signals applied to the first and second modulators for succeeding I=−1,Q=1's in the information signal are randomly selected among I,Qs of (−1,1) (1,1), (−1,−1) (1,−1), (1,1) (−1,1), (1,−1) (−1,−1), the modulating signals applied to the first and second modulators for succeeding I=1,Q=−1's in the information signal are randomly selected among I,Qs of (1,1) (1,−1), (1,−1) (1,1), (−1,1) (−1,−1), (−1,−1) (−1,1), and the modulating signals applied to the first and second modulators for succeeding I=1,Q=1's in the information signal are randomly selected among I,Qs of (1,1) (1,1), (−1, 1) (1,1), (−1,1) (−1,1), (1,−1) (1,−1).

24. A method of modulating a carrier with an information signal according to claim 13, wherein the plurality of serially coupled modulators comprises of first and second modulators that perform quadrature phase shift keying, the modulating signals applied to the first and second modulators for succeeding I=−1,Q=−1's in the information signal are periodically changed among I,Qs of (1,1) (−1,−1), (−1,−1) (1,1), (1,−1) (−1,1), (−1,−1), (1,1), the modulating signals applied to the first and second modulators for succeeding I=−1, Q=1's in the information signal are periodically changed among I,Qs of (−1,1) (1,1), (−1,−1) (1,−1), (1,1) (−1,1), (1,−1) (−1,−1), the modulating signals applied to the first and second modulators for succeeding I=1,Q=−1's in the information signal are periodically changed among I,Qs of (1,1) (1,−1), (1,−1) (1,1), (−1,1) (−1,−1), (−1, −1) (−1,1), and the modulating signals applied to the first and second modulators for succeeding I=1,Q=1's in the information signal are periodically changed among I,Qs of (1,1) (1,1), (−1, 1) (1,1), (−1,1) (−1,1), (1,−1) (1,−1).

25. An encoder for an information signal modulator having a plurality of serially coupled carrier suppression modulators each including a carrier input, a modulated carrier output, and a modulating signal input, a carrier being applied to the carrier input of a first modulator and the modulated carrier output of each modulator being coupled to the carrier input of a succeeding modulator, the encoder comprising:
a signal former responsive to the information signal for forming a plurality of modulating signals; and
a plurality of couplers each for coupling at least one modulating signal to the modulating signal input of each of the serially coupled modulators,
wherein a product of the modulating signals concurrently applied to the serially coupled modulators forms the information signal and the last of the serially coupled modulators produces a carrier suppressed information signal modulated output.

26. An encoder for a suppressed carrier modulator according to claim 25, wherein the plurality of serially coupled modulators includes first and second modulators that perform binary phase shift keying, the modulating signals applied to the first and second modulators (Q1, Q2) for succeeding "one" symbols in the information signal alternate between (1,−1) and (−1,1) and the modulating signals applied to the first and second modulators for succeeding "zero" symbols in the information signal alternate between (−1,−1) and (1,1).

27. An encoder for a suppressed carrier modulator according to claim 25, wherein the plurality of serially coupled modulators includes first and second modulators that perform binary phase shift keying, the modulating signals applied to the first and second modulators (Q1, Q2) for succeeding "one" symbols in the information signal randomly vary between (1,−1) and (−1,1) and the modulating signals applied to the first and second modulators for succeeding "zero" symbols in the information signal randomly vary between (−1,−1) and (1,1).

28. An encoder for a suppressed carrier modulator according to claim 25, wherein the plurality of serially coupled modulators includes first and second modulators that perform quadrature phase shift keying, the modulating signals applied to the first and second modulators for succeeding I=−1,Q=−1's in the information signal rotate among I,Qs of (1,1) (−1,−1), (−1,−1) (1,1), (1,−1) (−1,1), (−1,−1) (1,1 ), the modulating signals applied to the first and second modulators for succeeding I=−1,Q=−1's in the information signal rotate among I,Qs of (−1,1) (1,1), (−1,−1) (1,−1), (1,1) (−1,1), (1,−1) (−1,−1), the modulating signals applied to the first and second modulators for succeeding I=1,Q=−1's in the information signal rotate among I,Qs of (1,1) (1,−1), (1,−1) (1,1), (−1,1) (−1,−1), (−1,−1) (−1,1), and the modulating signals applied the first and second modulators for succeeding I=1,Q=1's in the information signal rotate among I,Qs of (1,1) (1,1), (−1,1) (1,1), (−1,1 ) (−1,1), (1,−1) (1,−1).

29. An encoder for a suppressed carrier modulator according to claim 25, wherein the plurality of serially coupled modulators includes first and second modulators that perform quadrature phase shift keying, the modulating signals applied to the first and second modulators for succeeding I=−1,Q=−1's in the information signal are randomly selected among I,Qs of (1,1) (−1,−1), (−1,−1) (1,1), (1,−1) (−1,1), (−1, −1) (1,1), the modulating signals applied to the first and second modulators for succeeding I=−1,Q=1's in the information signal are randomly selected among I,Qs of (−1,1) (1,1), (−1,−1) (1,−1), (1,1) (−1,1), (1,−1) (−1,−1), the modulating signals applied to the first and second modulators for succeeding I=1,Q=−1's in the information signal are randomly selected among I,Qs of (1,1) (1,−1), (1,−1) (1,1), (−1,1) (−1,−1), (−1,−1) (−1,1), and the modulating signals applied to the first and second modulators for succeeding I=1,Q=1's in the information signal are randomly selected among I,Qs of (1,1) (1,1), (−1,1) (1,1), (−1,1) (−1,1), (1,−1) (1, −1).

30. An encoder for a suppressed carrier modulator according to claim 25, wherein the plurality of serially coupled modulators includes first and second modulators that perform quadrature phase shift keying, the modulating signals applied to the first and second modulators for succeeding I=−1,Q=−1's in the information signal are periodically changed among I,Qs of (1,1) (−1,−1), (−1,−1) (1,1), (1,−1) (−1,1), (−1,−1) (1,1), the modulating signals applied to the first and second modulators for succeeding I=−1,Q=1's in the information signal are periodically changed among I,Qs of (−1,1) (1,1), (−1,−1) (1,−1), (1,1) (−1,1), (1,−1) (−1,−1), the modulating signals applied to the first and second modulators for succeeding I=1,Q=−1's in the information signal are periodically changed among I,Qs of (1,1) (1,−1), (1,−1) (1,1), (−1,1) (−1,−1), (−1,−1) (−1,1), and the modulating signals applied to the first and second modulators for succeeding I=1,Q=1's in the information signal are periodically changed among I,Qs of (1,1) (1,1), (−1,1) (1,1), (−1,1) (−1,1), (1,−1) (1,−1).

31. Apparatus for modulating a carrier with an information signal, comprising:
a plurality of serially coupled means for modulating an input signal with a modulating signal, each modulating means including a carrier input, a modulating signal input and a modulated carrier output, a carrier being coupled to the carrier input of a first of the serially coupled modulating means and the modulated carrier output of each modulating means being coupled to the carrier input of a succeeding modulating means;
means responsive to the information signal for generating modulating signals to be applied to modulating signal inputs of the plurality of modulating means, a product of the modulating signals forming the information signal,
wherein the modulating signals applied to each modulating means of the serially coupled modulating means modifies the modulated carrier output received at the carrier input of the respective modulating means to produce a carrier suppressed information signal modulated output at the last of the serially coupled modulating means.

32. Apparatus for modulating a carrier according to claim 31, wherein the modulating signals applied to one of the plurality of serially coupled modulating means produce a modulation component in the modulating means output of the one of the plurality of serially coupled modulating means that substantially removes a modulating component produced by a preceding modulating means of the plurality of serially coupled modulating means and the modulating signals applied to any one of the plurality of serial coupled modulating means also includes the information signal.

33. Apparatus for modulating a carrier according to claim 32, wherein the plurality of serially coupled modulating means includes first and second modulating means, the modulating signal applied to one of the first and second modulating means includes a component that is a reciprocal of the modulating signal applied to the other of the first and second modulating means.

34. Apparatus for modulating a carrier according to claim 32, wherein the information signal is an analog signal.

35. Apparatus for modulating a carrier according to claim 32, wherein the information signal is a QAM signal.

36. Apparatus for modulating a carrier according to claim 32, wherein the modulating signal applied to the first modulating means is a pseudo-random signal.

37. Apparatus for modulating a carrier according to claim 32, wherein the modulating signal applied to the first modulating means is a periodically varying signal.

38. Apparatus for modulating a carrier according to claim 31, wherein the plurality of serially coupled modulating means includes first and second modulating means that perform binary phase shift keying, the modulating signals applied to the first and second modulating means (Q1, Q2) for succeeding "one" symbols in the information signal alternate between (1,−1) and (−1,1) and the modulating signals applied to the first and second modulating means for succeeding "zero" symbols in the information signal alternate between (−1,−1) and (1,1).

39. Apparatus for modulating a carrier according to claim 31, wherein the plurality of serially coupled modulating means includes first and second modulating means that perform binary phase shift keying, the modulating signals applied to the first and second modulating means (Q1, Q2) for succeeding "one" symbols in the information signal randomly vary between (1,−) and (−1,1) and the modulating signals applied to the first and second modulating means for succeeding "zero" symbols in the information signal randomly vary between (−1,−1) and (1,1).

40. Apparatus for modulating a carrier wave according to claim 31, wherein the plurality of serially coupled modulating means includes first and second modulating means that perform quadrature phase shift keying, the modulating signals applied to the first and second modulating means for succeeding I=−1,Q=−1's in the information signal rotate among I,Qs of (1,1) (−1,−1), (−1,−1) (1,1), (1,−1) (−1,1), (−1,−1) (1,1), the modulating signals applied to the first and second modulating means for succeeding I=−1,Q=1's in the information signal rotate among I,Qs of (−1,1) (1,1), (−1,−1) (1,−1), (1,1) (−1,1), (1,−1) (−1,−1), the modulating signals applied to the first and second modulating means for succeeding I=1,Q=−1's in the information signal rotate among I,Qs of (1,1) (1,−1), (1,−1) (1,1), (−1,1) (−1,−1), (−1,−1) (−1,1), and the modulating signals applied the first and second modulating means for succeeding I=1,Q=1's in the information signal rotate among I,Qs of (1,1) (1,1), (−1,1) (1,1), (−1,1) (−1,1), (1,−1) (1,−1).

41. Apparatus for modulating a carrier wave according to claim 31, wherein the plurality of serially coupled modulating means includes first and second modulating means that perform quadrature phase shift keying, the modulating signals applied to the first and second modulating means for succeeding I=−1,Q=−1's in the information signal are randomly selected among I,Qs of (1,1) (−1,−1), (−1,−1) (1,1), (1,−1) (−1,1), (−1,−1) (1,1), the modulating signals applied to the first and second modulating means for succeeding I=−1,Q=1's in the information signal are randomly selected among I,Qs of (−1,1) (1,1), (−1,−1) (1,−1), (1,1) (−1,1), (1,−1) (−1,−1), the modulating signals applied to the first and second modulating means for succeeding I=1,Q=−1's in the information signal are randomly selected among I,Qs of (1,1) (1,−1), (1,−1) (1,1), (−1,1) (−1,−1), (−1,−1) (−1,1), and the modulating signals applied to the first and second modulating means for succeeding I=1,Q=1's in the information signal are randomly selected among I,Qs of (1,1) (1,1), (−1,1) (1,1), (−1,1) (−1,1), (1,−1) (1,−1).

42. Apparatus for modulating a carrier wave according to claim 31, wherein the plurality of serially coupled modulating means includes first and second modulators that perform quadrature phase shift keying, the modulating signals applied to the first and second modulating means for succeeding I=−1,Q=−1's in the information signal are periodically changed among I,Qs of (1,1) (−1,−1), (−1,−1) (1,1), (1,−1) (−1,1), (−1,−1) (1,1), the modulating signals applied to the first and second modulating means for succeeding I=−1,Q=1's in the information signal are periodically changed among I,Qs of (−1,1) (1,1), (−1,−1) (1,−1), (1,1) (−1,1), (1,−1) (−1,−1), the modulating signals applied to the first and second modulating means for succeeding I=1,Q=−1's in the information signal are periodically changed among I,Qs of (1,1) (1,−1), (1,−1) (1,1), (−1,1) (−1,−1), (−1, −1) (−1,1), and the modulating signals applied to the first and second modulating means for succeeding I=1,Q=1's in the information signal are periodically changed among I,Qs of (1,1) (1,1), (−1,1) (1,1), (−1,1) (−1,1), (1,−1) (1,−1).

\* \* \* \* \*

UNITED STATES PATENT AND TRADEMARK OFFICE
CERTIFICATE OF CORRECTION

PATENT NO. : 7,369,624 B2 Page 1 of 1
APPLICATION NO. : 10/856801
DATED : May 6, 2008
INVENTOR(S) : Leonard A. Atkinson It is certified that error appears in the above-identified patent and that said Letters Patent is hereby corrected as shown below:

In Claim 8, column 15, line 11, after the word "modulators" please insert --(Q1, Q2)-- (emphasis added).

In Claim 39, column 20, line 27, please replace "between (1,-)" with --between (1,-1)-- (emphasis added).

In Claim 40, column 20, line 45, after the word "applied" please insert --to-- (emphasis added).

Signed and Sealed this

Twenty-ninth Day of July, 2008

JON W. DUDAS
*Director of the United States Patent and Trademark Office*